(12) United States Patent
Xu et al.

(10) Patent No.: US 8,291,288 B2
(45) Date of Patent: Oct. 16, 2012

(54) METHOD AND DEVICE FOR ENCODING THE LOW DENSITY GENERATOR MATRIX CODE

(75) Inventors: Jun Xu, Shenzhen (CN); Jin Xu, Shenzhen (CN); Zhifeng Yuan, Shenzhen (CN); Yuanli Fang, Shenzhen (CN); Liujun Hu, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 372 days.

(21) Appl. No.: 12/666,454

(22) PCT Filed: Jun. 2, 2008

(86) PCT No.: PCT/CN2008/071167
§ 371 (c)(1),
(2), (4) Date: Dec. 23, 2009

(87) PCT Pub. No.: WO2009/049504
PCT Pub. Date: Apr. 23, 2009

(65) Prior Publication Data
US 2010/0185915 A1      Jul. 22, 2010

(30) Foreign Application Priority Data
Oct. 19, 2007   (CN) .......................... 2007 1 0163344

(51) Int. Cl.
*H03M 13/00* (2006.01)

(52) U.S. Cl. ........................................ 714/752; 714/758

(58) Field of Classification Search .................. 714/752, 714/758
See application file for complete search history.

(56) References Cited

U.S. PATENT DOCUMENTS
7,483,496 B2 *   1/2009   Eroz et al. ...................... 375/316
(Continued)

FOREIGN PATENT DOCUMENTS
CN          1614896 A       5/2005
(Continued)

OTHER PUBLICATIONS
International Search Report of International Application No. PCT/CN2008/071167, Date of Completion: Aug. 29, 2008, Date of Mailing: Sep. 18, 2008, pp. 1-4.
(Continued)

*Primary Examiner* — Yolanda L Wilson
(74) *Attorney, Agent, or Firm* — Oppedahl Patent Law Firm LLC

(57) ABSTRACT

A method and system for encoding the low density generator matrix code are disclosed. The encoding method includes the following steps: S102, constructing a generator matrix $G_{ldgc}$ with L rows and N+L−K columns, wherein a phalanx $G_{ldgc}$ (1:L, 1:L) which consists of L rows and the first L columns of the generator matrix $G_{ldgc}$ is an upper triangular matrix or a lower triangular matrix, the K, L and N being positive integers, and K<L<N; S104, adding L−K known bits to the K-length information bit sequence that needs to be encoded to generate an information bit sequence m which has a length of L; S106, according to $I \times G_{ldgc}(1:L, 1:L) = m$, using the phalanx $G_{ldgc}(1:L, 1:L)$ which consists of L rows and the first L columns of the generator matrix $G_{ldgc}$ and the information bit sequence m which has a length of L, to generate an intermediate variable I, and according to $C = I \times G_{ldgc}$, using the generator matrix $G_{ldgc}$ to encode an intermediate variable I, to generate an encoding sequence which has a length of N+L−K; and S108, deleting L−K known bits from the encoding sequence which has a length of N+L−K, to generate an encoding sequence which has a length of N.

22 Claims, 6 Drawing Sheets

U.S. PATENT DOCUMENTS

| | | | |
|---|---|---|---|
| 7,493,547 B2 * | 2/2009 | Kim et al. | 714/758 |
| 7,502,987 B2 * | 3/2009 | Kyung et al. | 714/781 |
| 7,549,110 B2 * | 6/2009 | Stek et al. | 714/776 |
| 8,086,934 B2 * | 12/2011 | Yokokawa et al. | 714/758 |
| 8,103,935 B2 * | 1/2012 | Matsumoto et al. | 714/758 |
| 2004/0128607 A1 | 7/2004 | Sutskover | |
| 2004/0153934 A1 | 8/2004 | Jin et al. | |
| 2006/0123314 A1 * | 6/2006 | Kim et al. | 714/758 |
| 2006/0156183 A1 * | 7/2006 | Kim et al. | 714/758 |
| 2007/0033482 A1 * | 2/2007 | Seki | 714/758 |
| 2007/0033485 A1 * | 2/2007 | Cohen et al. | 714/758 |
| 2007/0226583 A1 * | 9/2007 | Kim et al. | 714/758 |
| 2008/0168324 A1 * | 7/2008 | Xu et al. | 714/758 |
| 2008/0222487 A1 * | 9/2008 | Matsumoto | 714/758 |

FOREIGN PATENT DOCUMENTS

| | | |
|---|---|---|
| CN | 1732626 A | 2/2006 |
| CN | 1783730 A | 6/2006 |
| CN | 1855730 A | 11/2006 |
| EP | 1596501 A1 | 12/2005 |
| RU | 2007042 C1 | 1/1994 |
| RU | 2004139195 A | 6/2006 |
| WO | 2004062112 A2 | 7/2004 |

OTHER PUBLICATIONS

Written Opinion of the International Searching Authority PCT/CN2008/071167 filing date Jun. 2, 2008.

International Search Report in international application No. PCT/CN2008/071167, mailed Sep. 18, 2008.

* cited by examiner precoding unit block code encoding unit

METHOD AND DEVICE FOR ENCODING THE LOW DENSITY GENERATOR MATRIX CODE

TECHNICAL FIELD

The present invention relates to the field of communications, especially to a method and device for encoding the low density generator matrix code.

BACKGROUND

Erasure channel is an important type of channel model, for example, files are transmitted on the Internet based on data packet communications, and generally each data packet is either received by a receiver correctly or not received by the receiver at all. Error detection and retransmission mechanism adopted in Transmission Control Protocol (TCP) regarding to network packet loss is to control the data packets that need to be retransmitted by using the feedback channel from an input end to an output end. When the receiver detects packet loss, it will generate a retransmitting control signal, until the data packets are received completely and correctly; when the receiver receives a data packet, it will likewise generate a receiving confirmation signal. Also the sender will track every data packet until a notification signal is fed back, otherwise it will resend the data packet.

A data broadcasting service based on a stream mode and a file download mode is a point-to-multipoint service, in which feedback is not allowed, so traditional error detection and retransmission mechanism may not be applied, and Forward Error Correction (FEC) has to be adopted to ensure reliable transmission. FEC codes of the classical application layer include Reed-Solomon (RS) codes, digital Fountain codes and so on. Encoding/decoding of RS codes is of high complexity, so RS codes are usually applied to short codes. Luby Transform (LT) codes and Raptor codes are two types of digital Fountain codes that have practical applications. LT codes have linear encoding and decoding time, with essential enhancement in comparison with RS codes, but Raptor codes adopts precoding technique, so Raptor codes have a greater decoding efficiency. Raptor codes are adopted as a FEC encoding scheme in both 3GPP Multimedia Broadcast/Multicast Service (MBMS) and Digital Video Broadcasting (DVB).

As a group of code blocks with constant length, linear block codes are denoted as (n, k) and are usually used for FEC. During the encoding, k information bits are encoded into an n-bit code block. Since $2^k$ code words of the block codes (n, k) constitute a k-dimensional subspace, the $2^k$ code words may definitely be generated by k linearly independent basements, and if the k linearly independent basements are written in a form of matrix, then $$G = \begin{bmatrix} g_{1,n-1} & g_{1,n-2} & \cdots & g_{1,0} \\ g_{2,n-1} & g_{2,n-2} & \cdots & g_{2,0} \\ \vdots & \vdots & & \vdots \\ g_{k,n-1} & g_{k,n-2} & \cdots & g_{k,0} \end{bmatrix},$$

wherein, any code word in the block codes (n, k) may be generated by a linear combination of this group of basements, namely $$C = m \cdot G = \begin{bmatrix} m_1 & m_2 & \cdots & m_{n-k} \end{bmatrix} \cdot \begin{bmatrix} g_{1,n-1} & g_{1,n-2} & \cdots & g_{1,0} \\ g_{2,n-1} & g_{2,n-2} & \cdots & g_{2,0} \\ \vdots & \vdots & & \vdots \\ g_{k,n-1} & g_{k,n-2} & \cdots & g_{k,0} \end{bmatrix}.$$

Here G is called a generator matrix of codes. Obviously, for each row of the generator matrix only linear independence needs to be satisfied (disregarding of the minimum distance), but the basements of a k-dimensional space may be composed of k selected linearly independent vectors, so the generator matrix G of codes is not unique, no matter which form is adopted, however, they generate the same subspace, namely the same (n, k) block codes.

If the first k bits of the encoded code words are the same as information bits, this code is called systematic code. The encoding procedure is that of generating n-bit code length by k information bits, and error detection and error correction are implemented by adding n-k check bits.

LT codes are also encoded by using the sparsity of the generator matrix, in comparison with the Low Density Generator Matrix Code (LDGC) of ZTE Corporation, LT codes do not support encoding method of systematic codes, so it is difficult for LT codes to meet the requirement of some practical FEC encoding; Raptor codes support systematic codes, but need a separate precoding procedure, namely need a precoding matrix, therefore, leading to a higher encoding complexity, while the LDGC directly uses a generator matrix to encode without needing an extra precoding matrix, and the LDGC takes use of back substitution method to solve an upper (or a lower) triangular function while encoding, so the encoding complexity of the LDGC is much lower than that of Raptor codes. In a word, compared with LT codes, the LDGC has an advantage in supporting systematic codes; compared with Raptor codes, the LDGC has an advantage in lower encoding complexity.

SUMMARY

In order to reduce the encoding complexity and obtain a better code-performance, a method and device for encoding the low density generator matrix code are provided in the present invention.

According to one aspect of the present invention, a method for encoding the low density generator matrix code is provided. The method for encoding the low density generator matrix code according to embodiments of the present invention comprises the following steps: constructing a generator matrix $G_{ldgc}$ with L rows and N+L−K columns, wherein, a phalanx $G_{ldgc}(1{:}L, 1{:}L)$ that consists of L rows and the first L columns of the generator matrix $G_{ldgc}$ is an upper triangular matrix or a lower triangular matrix, the K, L and N being positive integers, and K L N; adding L−K known bits to a K-length information bit sequence that needs to be encoded, generating an information bit sequence m with a length of L; according to I×$G_{ldgc}(1{:}L, 1{:}L)$ m, using the phalanx $G_{ldgc}(1{:}L, 1{:}L)$ that consists of L rows and the first L columns of the generator matrix $G_{ldgc}$ and the L-length information bit sequence m, generating an intermediate variable I, and according to C I×$G_{ldgc}$, encoding the intermediate variable I by using the generator matrix $G_{ldgc}$, and generating an encoding sequence that has a length of N+L−K; and deleting L−K known bits from the encoding sequence that has a length of N+L−K, generating an encoding sequence that has a length of N.

Wherein, when the phalanx $G_{ldgc}(1:L, 1:L)$ that consists of L rows and the first L columns of the generator matrix $G_{ldgc}$ is an upper-left triangular matrix or a lower-left triangular matrix, the L−K known bits are added in front of the K-length information bit sequence that is to be encoded. When the phalanx $G_{ldgc}(1:L, 1:L)$ that consists of L rows and the first L columns of the generator matrix $G_{ldgc}$ is an upper-right triangular matrix or a lower-right triangular matrix, the L−K known bits are added after the K-length information bit sequence that is to be encoded. Wherein, a column weight of the generator matrix $G_{ldgc}$ is in accordance with a degree distribution principle similar to that of LT codes.

According to another aspect of the present invention, a method for encoding the low density generator matrix code is provided. The method for encoding the low density generator matrix code according to embodiments of the present invention comprises the following steps: constructing a generator matrix $G_{ldgc}$ with K rows and N columns, wherein, a phalanx $G_{ldgc}(1:K, 1:K)$ that consists of K rows and the first K columns of the generator matrix $G_{ldgc}$ is an upper triangular matrix or a lower triangular matrix, the K and N being positive integers, and K N; according to $I \times G_{ldgc}(1:K, 1:K)$ s, using a K-length information bit sequence s that needs to be encoded and the phalanx $G_{ldgc}(1:K, 1:K)$ that consists of K rows and the first K columns of the generator matrix $G_{ldgc}$, generating an intermediate variable I; according to C $I \times G_{ldgc}$, encoding the intermediate variable I by using the generator matrix $G_{ldgc}$, and generating a code word that has a length of N. Wherein, a column weight of the generator matrix $G_{ldgc}$ is in accordance with a degree distribution principle similar to that of LT codes. The phalanx $G_{ldgc}(1:K, 1:K)$ that consists of K rows and the first K columns of the generator matrix $G_{ldgc}$ may be an upper-left triangular matrix, a lower-left triangular matrix, an upper-right triangular matrix, or a lower-right triangular matrix.

According to another aspect of the present invention, a device for encoding the low density generator matrix code is provided. The device for encoding the low density generator matrix code according to embodiments of the present invention comprises: a matrix generating unit, being used for generating a generator matrix $G_{ldgc}$ with L rows and N+L−K columns, outputting the generated matrix $G_{ldgc}$ to a block code encoding unit, and outputting a phalanx $G_{ldgc}(1:L, 1:L)$ that consists of L rows and the first L columns of the generator matrix $G_{ldgc}$, to a precoding unit, wherein, the phalanx $G_{ldgc}(1:L, 1:L)$ that consists of L rows and the first L columns of the generator matrix $G_{ldgc}$, is an upper triangular matrix or a lower triangular matrix, the K, L and N being positive integers, and K L N; a bit filling unit, being used for adding L−K known bits to a K-length information bit sequence that is to be encoded, generating an information bit sequence m with a length of L, and outputting the L-length information bit sequence m to the precoding unit; the precoding unit, being used for according to $I \times G_{ldgc}(1:L, 1:L)$ m, using the phalanx $G_{ldgc}(1:L, 1:L)$ that consists of L rows and the first L columns of the generator matrix $G_{ldgc}$, and the L-length information bit sequence m, generating an intermediate variable I, and outputting the intermediate variable I to the block code encoding unit (the precoding unit may be a unit for solving upper and/or lower triangular function, with two inputs, one being $G_{ldgc}(1:L, 1:L)$ and the other being m, and one output that is I); the block code encoding unit, being used for according to C $I \times G_{ldgc}$, using the generator matrix $G_{ldgc}$ to encode the intermediate variable I, generating an encoding sequence that has a length of N+L−K (the block code encoding unit may be a matrix square unit, with two inputs, which are respectively $G_{ldgc}$, and I, and one output that is C); and a bit deleting unit, being used for deleting L−K known bits from the encoding sequence that has a length of N+L−K, generating an encoding sequence that has a length of N.

Wherein, the phalanx $G_{ldgc}(1:L, 1:L)$ that consists of L rows and the first L columns of the generator matrix $G_{ldgc}$, may be an upper-left triangular matrix, a lower-left triangular matrix, an upper-right triangular matrix or a lower-right triangular matrix. When the phalanx $G_{ldgc}(1:L, 1:L)$ that consists of L rows and the first L columns of the generator matrix $G_{ldgc}$, is an upper-left triangular matrix or lower-left triangular matrix, the bit filling unit adds L−K known bits in front of the K-length information bit sequence that needs to be encoded. When the phalanx $G_{ldgc}(1:L, 1:L)$ that consists of L rows and the first L columns of the generator matrix $G_{ldgc}$ is an upper-right triangular matrix or lower-right triangular matrix, the bit filling unit adds L−K known bits after the K-length information bit sequence that needs to be encoded. A column weight of the generator matrix $G_{ldgc}$ is in accordance with a degree distribution principle similar to that of LT codes.

According to another aspect of the present invention, a device for encoding the low density generator matrix code is provided. The device for encoding the low density generator matrix code according to embodiments of the present invention comprises: a matrix generating unit, being used for generating a generator matrix $G_{ldgc}$, with K rows and N columns, wherein, a phalanx $G_{ldgc}(1:K, 1:K)$ that consists of K rows and the first K columns of the generator matrix $G_{ldgc}$, is an upper triangular matrix or a lower triangular matrix, the K and N being positive integers, and K N; a precoding unit, being used for according to $I \times G_{ldgc}(1:K, 1:K)$ s, using a K-length information bit sequence s that is to be encoded and the phalanx $G_{ldgc}(1:K, 1:K)$ that consists of K rows and the first K columns of the generator matrix $G_{ldgc}$, generating an intermediate variable I; and a block encoding unit, being used for according to C $I \times G_{ldgc}$, using the generator matrix $G_{ldgc}$ to encode the intermediate variable I, and generating a code word that has a length of N.

Wherein, the phalanx $G_{ldgc}(1:K, 1:K)$ that consists of K rows and the first K columns of the generator matrix $G_{ldgc}$ may be an upper-left triangular matrix, a lower-left triangular matrix, an upper-right triangular matrix, or a lower-right triangular matrix. The column weight of generator matrix $G_{ldgc}$, is in accordance with the degree distribution principle similar to that of LT codes.

According to the present invention, a better code-performance can be obtained while reducing encoding complexity.

BRIEF DESCRIPTION OF THE DRAWINGS

The drawings illustrated hereby are used for providing further understanding of the present invention, as one part of this application, and the exemplary embodiments and illustration thereof are used to explain the present invention, but not to confine the present invention improperly. In the drawings.

DETAILED DESCRIPTION

The Low Density Generator Matrix Code (LDGC) is a kind of linear block codes, and non-zero elements of a LDGC generator matrix are usually sparse. Meanwhile, the LDGC is also a kind of systematic code, and a phalanx composed by the first k columns of the LDGC generator matrix is usually an upper triangular matrix or a lower triangular matrix, inversion of the matrix may be obtained by the method of iteration. The encoding procedure of LDGC includes getting an intermediate variable by using a corresponding relation between an information bit of systematic code and the intermediate variable firstly, and then multiplying the intermediate variable by the generator matrix to get encoded code words. The decoding procedure of LDGC includes getting the intermediate variable by using the generator matrix firstly, and then figuring out the information bit according to the transformation relation between the information bit and the intermediate variable. Embodiments of the present invention will be illustrated in detail with reference to the drawings.

Figure 1:
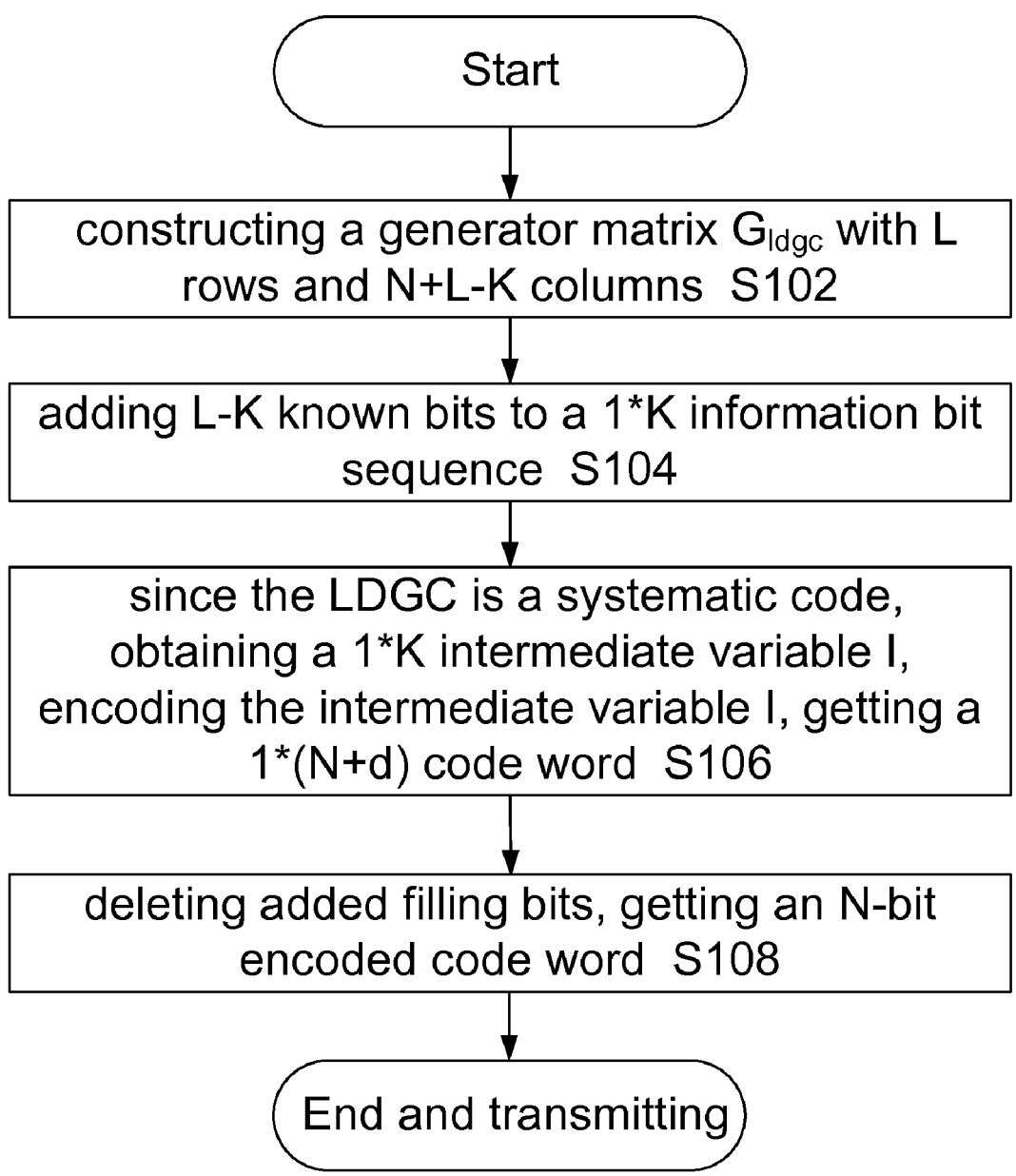
FIG. 1 is a flowchart illustrating the LDGC encoding method according to an embodiment of the present invention.

With reference to FIG. 1, which illustrates the procedure of encoding a K-length information bit sequence, and then outputting an N-length encoded code word bit sequence to a subsequent processing unit. Wherein, the length of the check bit is M=N−K, and the code rate is r=K/N. As shown in FIG. 1, the LDGC encoding method according to an embodiment of the present invention comprises the following steps:

S102, a generator matrix $G_{ldgc}$ with L rows and N+L−K columns is constructed. Wherein, a phalanx $G_{ldgc}(1:L, 1:L)$ that consists of the first L columns and all rows of this generator matrix is an upper triangular matrix (or a lower triangular matrix), the K, L and N being given positive integers, and K<L<N;

S104, d=L−K known filling bits are added to a 1*K information bit sequence s, to construct a 1*L information bit sequence m;

S106, LDGC is systematic code, so I×$G_{ldgc}$(1:L, 1:L)=m. Since the $G_{ldgc}$(1:L, 1:L) is an upper triangular matrix (or a lower triangular matrix), an intermediate variable I of 1*K is obtained by solving the function, and according to C=I×$G_{ldgc}$, the intermediate variable I is encoded to get a 1*(N+d) code word;

S108, the filling bits added in the step S104 are deleted from the 1*(N+d) code word generated in the above step, and finally an N-bit encoded code word is obtained and sent out.

Figure 3:
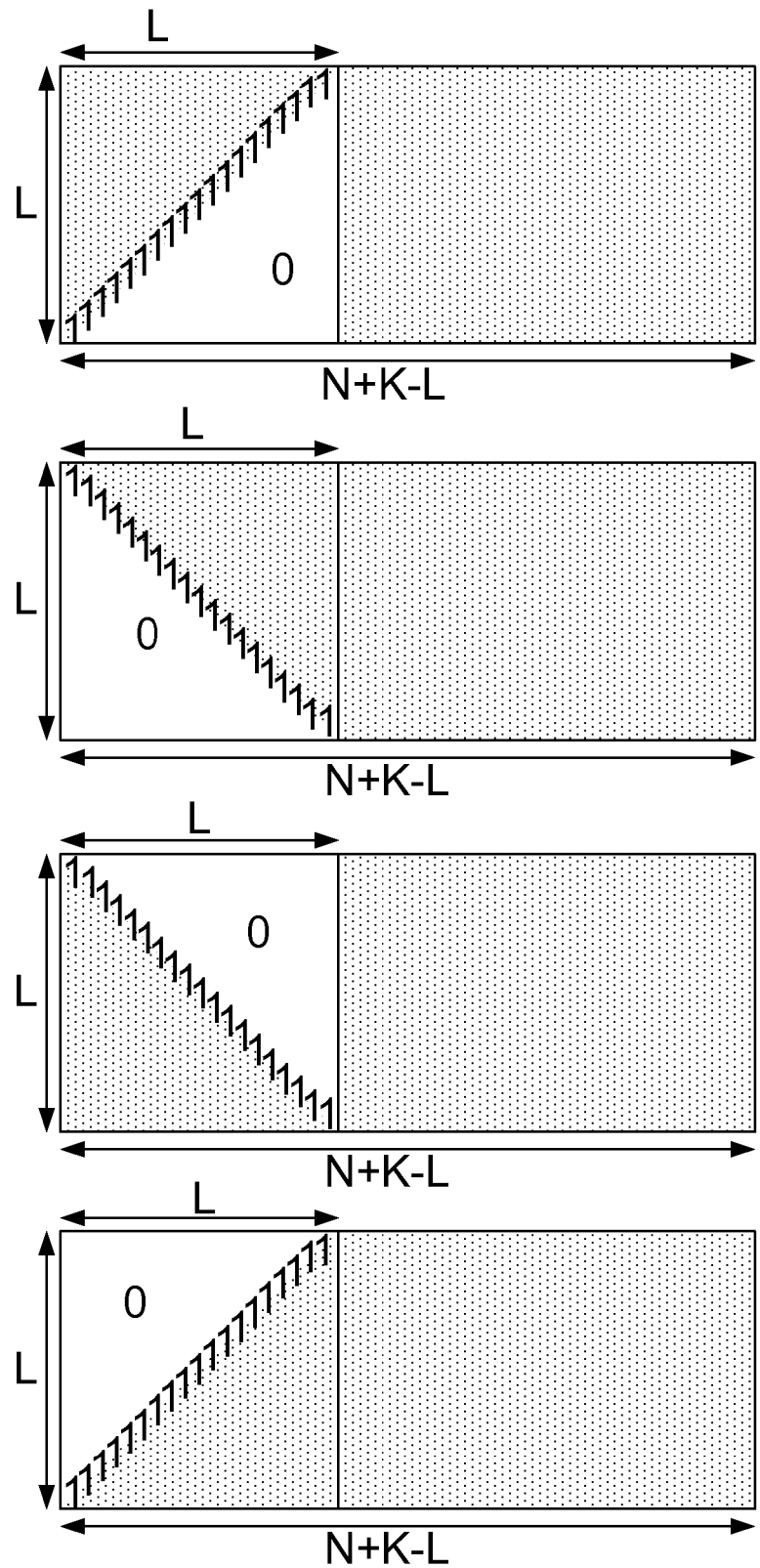
FIG. 3 is a schematic diagram illustrating the LDGC generator matrix.

Wherein, in each column of the generator matrix, a number of element "1" (i.e. a column weight) must be in accordance with a certain degree distribution principle. The phalanx composed by the first L columns and all rows of the generator matrix may be an upper-left triangular matrix, a lower-left triangular matrix, an upper-right triangular matrix, or a lower-right triangular matrix (as shown in FIG. 3).

Wherein, if $G_{ldgc}$(1:L, 1:L) is an upper-left triangular matrix or a lower-left triangular matrix, then for the information bit sequence whose initial length is K, d=L−K known filling bits are added in front of the K information bit sequences. If $G_{ldgc}$(1:L, 1:L) is an upper-right triangular matrix or a lower-right triangular matrix, then for the information bit sequence whose initial length is K, d=L−K known filling bits are added after the K information bit sequences. To be noted, positions where the filling bits are added are not limited as above.

Figure 2:
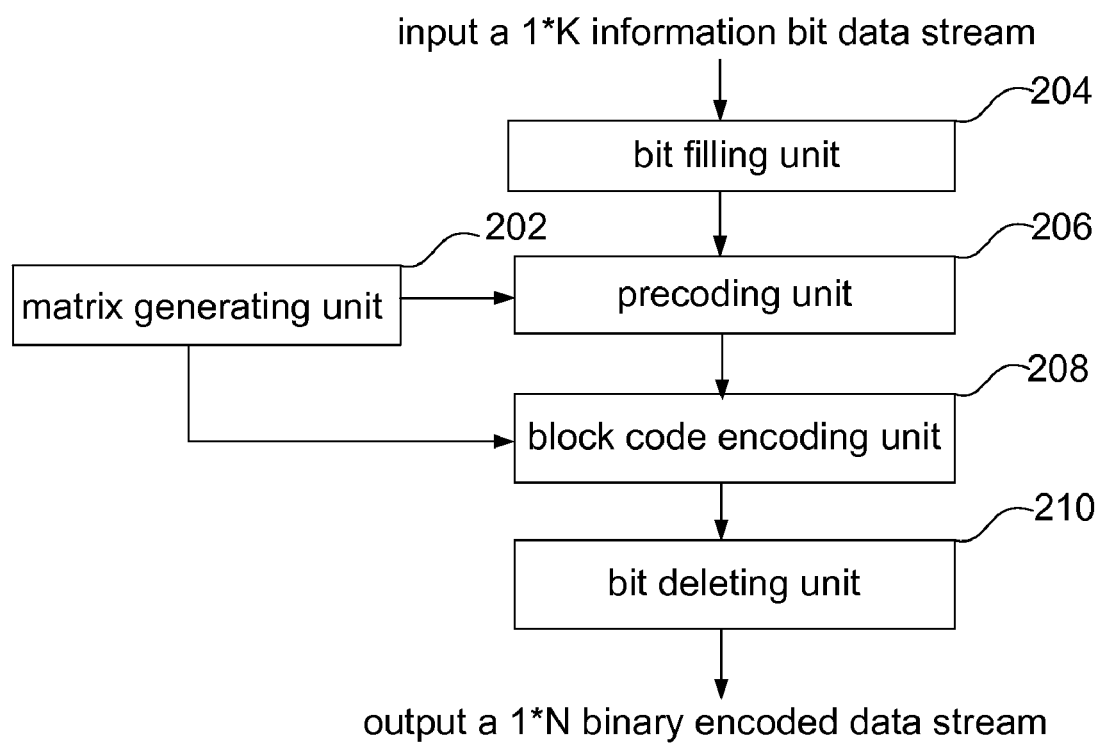
FIG. 2 is a block diagram illustrating the LDGC encoding device according to an embodiment of the present invention.
Figure 8:
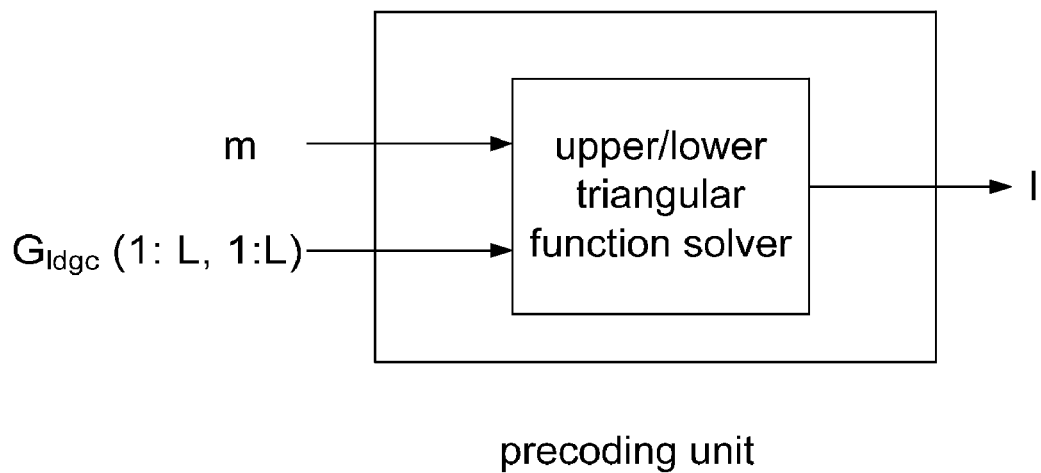
FIG. 8 is a schematic diagram illustrating the precoding unit in the LDGC encoding device according to another embodiment of the present invention.
Figure 9:
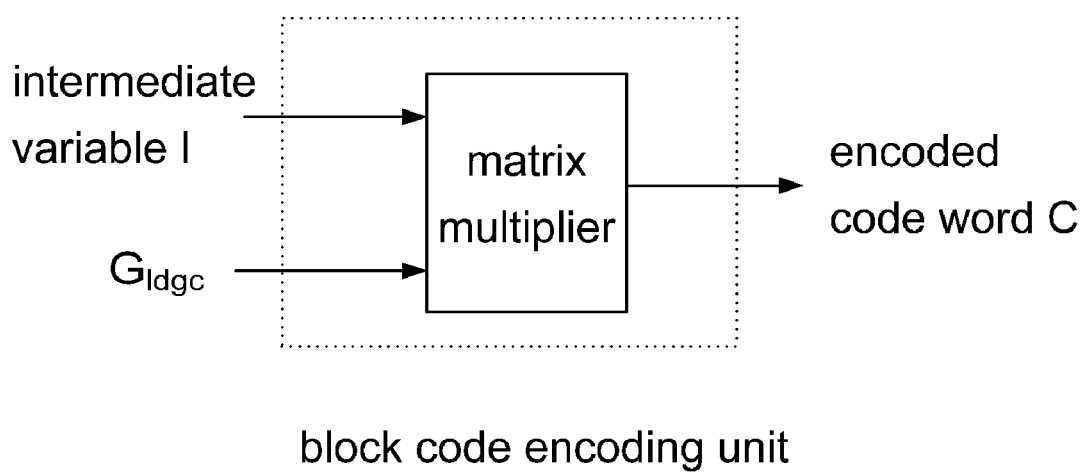
FIG. 9 is a schematic diagram illustrating the block code encoding unit in the LDGC encoding device according to another embodiment of the present invention.

With reference to FIG. 2, an LDGC encoding device according to an embodiment of the present invention is illustrated. The LDGC encoding device is used to encode an input K-bit binary information bit stream, and then output an N-bit binary code word bit stream to the subsequent processing unit. As shown in FIG. 2, the LDGC encoding device comprises:

a matrix generating unit 202, being used for generating a generator matrix $G_{ldgc}$ with L rows and N+L−K columns. Wherein, a phalanx $G_{ldgc}$(1:L, 1:L) that consists of L columns and all rows of the generator matrix $G_{ldgc}$, is an upper triangular matrix (or a lower triangular matrix). The matrix generator outputs $G_{ldgc}$(1:L, 1:L) to a subsequent precoding unit, and outputs $G_{ldgc}$(1:L, 1:N+L−K) to a subsequent block code encoding unit. Wherein, the K, L and N are given positive integers, and K L<N;

a bit filling unit 204, being used for adding d=L−K known filling bits to an input 1*K information bit sequence s, generating a 1*L information bit stream m, and outputting the generated information bit stream m to the precoding unit;

the precoding unit 206, being used for generating a 1*L intermediate variable I by solving the function of the 1*L information bit stream m, and outputting an intermediate variable I to a block code encoder (as shown in FIG. 8, the precoding unit may be a unit for solving an upper and/or a lower triangular function, with two inputs, one being $G_{ldgc}$(1:L, 1:L), and the other being the information bit sequence m that has a length of L, and one output that is the intermediate variable I);

the block code encoding unit 208, being used for encoding the intermediate variable I, generating a 1*(N+d) binary code word bit stream C, and outputting C to a bit deleting unit (as shown in FIG. 9, the block code encoding unit may be a unit for the matrix multiplying, with two inputs, one being $G_{ldgc}$ and the other being the L-length intermediate variable I, and the output is the encoded code word C);

a bit deleting unit 210, being used for deleting the filled d filling bits from the bit filling unit, and finally obtaining an N-bit encoded code word.

Wherein, the matrix generating unit determines a generator matrix according to the following rules: in every column of the generator matrix, the number of element "1" (i.e. the column weight) must be in accordance with a certain degree distribution principle. The phalanx composed by the first L columns and all rows of the generator matrix is an upper-left triangular matrix, a lower-left triangular matrix, an upper-right triangular matrix, or a lower-right triangular matrix (as shown in FIG. 3).

Wherein, when $G_{ldgc}$(1:L, 1:L) is an upper-left triangular matrix or a lower-left triangular matrix, the bit filling unit adds d=L−K known filling bits in front of the K information bit sequences. When $G_{ldgc}$(1:L, 1:L) is an upper-right triangular matrix or a lower-right triangular matrix, the bit filling unit adds d=L−K known filling bits after the K information bit sequences. To be noted, positions where the filling bits are added are not limited as above.

Wherein, because LDGC is a systematic code with $I \times G_{ldgc}(1:L, 1:L)=m$, the precoding unit solves the function when $G_{ldgc}(1:L, 1:L)$ is an upper triangular matrix (or a lower triangular matrix) to obtain the 1*L intermediate variable I.

Wherein, the block code encoding unit encodes the intermediate variable I according to $C=I \times G_{ldgc}$, and gets a 1*(N-d) binary code word stream.

For example, there is a 1*K=1*24 binary information bit data stream s (s may be denoted as D8AB13 in hexadecimal format) that is to be encoded by the encoding device according to the embodiments of the present invention into 72-bit LDGC code words, so K=24, N=72.

Figure 4:
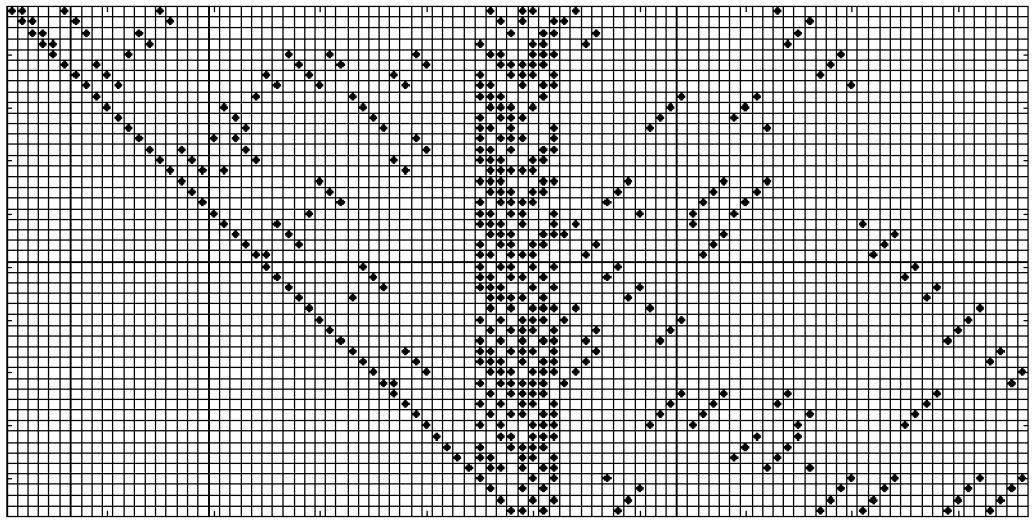
FIG. 4 is an example of the LDGC generator matrix with filled bits according to an embodiment of the present invention.

The matrix generating unit generates a generator matrix $G_{ldgc}$ with L=48 rows and N+L-K=96 columns. Wherein, the $G_{ldgc}$, adopts a degree distribution principle similar to that of LT codes, and a phalanx $G_{ldgc}(1:L, 1:L)=G_{ldgc}(1:48, 1:48)$ composed by the first L columns and all rows of the $G_{ldgc}$ is an upper-right triangular matrix, as shown in FIG. 4 (wherein, black spots denote element "1", while blank positions denote element "0"). The matrix generating unit outputs $G_{ldgc}(1:L, 1:L)=G_{ldgc}(1:48, 1:48)$ to the subsequent precoding unit, and outputs $G_{ldgc}(1:L, 1:N+L-K)=G_{ldgc}(1:48, 1:96)$ to the subsequent block code encoding unit.

The bit filling unit adds d=L-K=24 known filling bits p (p is denoted as 9A0C2C in hexadecimal format) after the 1*K=1*24 input information bit stream, to generate a 1*L=1*48 information bit stream m (m is denoted as D8AB139A0C2C in hexadecimal format), and outputs m to the precoding unit.

According to the characteristic of the LDGC that is a systematic code ($I \times G_{ldgc}(1:48, 1:48)=m$, because the LDGC is a systematic code), and $G_{ldgc}(1:L, 1:L)=G_{ldgc}(1:48, 1:48)$ is an upper-right triangular matrix, the precoding unit solves the function of the input 1*K=1*24 information bit stream s to get a 1*L=1*48 intermediate variable I (I is denoted as 942DA94E0A24 in hexadecimal format), and outputs I to the block code encoding unit.

According to $C=I \times G_{ldgc}$, the block code encoding unit encodes the input intermediate variable I to generate a 1*(N+d)=1*96 binary code word c (c is denoted as D8AB139A0C2CCD3AC516ED52 in hexadecimal format), and outputs c to the bit deleting unit.

The bit deleting unit deletes the added d=24 filling bits from the 1*(N+d)=1*96 binary code word c, and finally gets an N=72 bits encoded code word (denoted as D8AB13CD3AC516ED52 in hexadecimal format) and sends it out.

Figure 5:
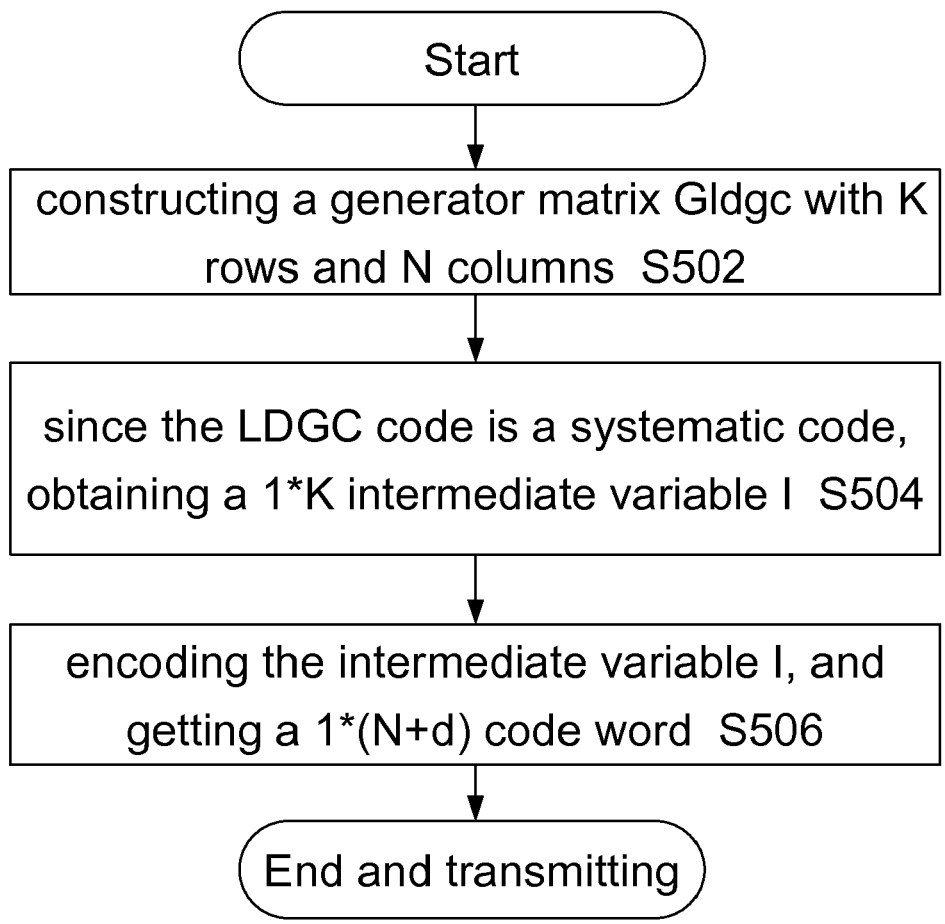
FIG. 5 is a flowchart illustrating the LDGC encoding method according to another embodiment of the present invention.

In order to reduce the complexity of encoding, another LDGC encoding method is provided in the present invention. The encoding method is different from the above encoding method in that the bit filling and bit deleting are not comprised. With reference to FIG. 5, the procedure of encoding a K-length information bit sequence and then outputting an encoded code word bit sequence with a length of N to the subsequent processing unit is illustrated. Wherein, the length of check bit is M=N-K, and code rate is r=K/N. As shown in FIG. 5, the LDGC encoding method according to another embodiment of the present invention comprises the following steps:

S502, a generator matrix $G_{ldgc}$ with K rows and N columns is constructed. Wherein, a phalanx $G_{ldgc}(1:K, 1:K)$ consisting of all rows and the first K columns of the generator matrix $G_{ldgc}$ is an upper triangular matrix (or a lower triangular matrix), the K and N being given positive integers, and K N;

S504, as LDGC is a systematic code, then $I \times G_{ldgc}(1:K, 1:K)$ s, since the phalanx $G_{ldgc}(1:K, 1:K)$ is an upper triangular matrix (or a lower triangular matrix), an intermediate variable I is obtained by solving the function;

S506, according to $C I \times G_{ldgc}$, the intermediate variable I is encoded to get a 1*N code word.

Wherein, in each column of the generator matrix, the number of element "1" (i.e. the column weight) must be in accordance with a certain degree distribution principle; the phalanx composed by the first K columns and all rows of the generator matrix is an upper-left triangular matrix, a lower-left triangular matrix, an upper-right triangular matrix, or a lower-right triangular matrix (as shown in FIG. 3).

Figure 6:
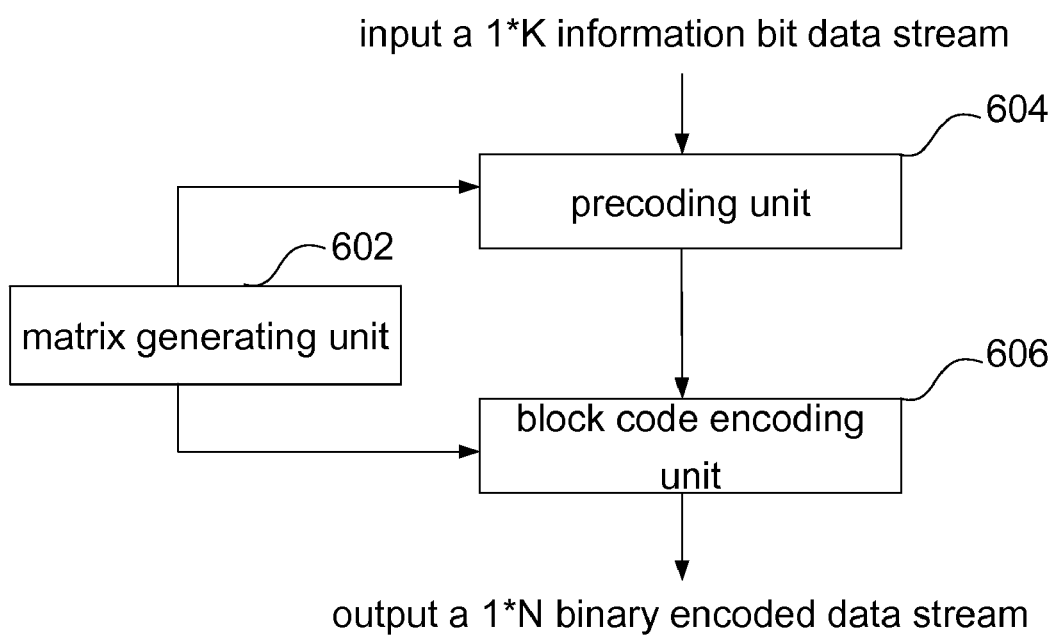
FIG. 6 is a block diagram illustrating the LDGC encoding device according to another embodiment of the present invention.

With reference to FIG. 6, a LDGC encoding device according to another embodiment of the present invention is illustrated. The encoding device is used for encoding an input K-bit binary information bit stream, and then outputting an N-bit binary code word bit stream to the subsequent processing unit. As shown in FIG. 6, the LDGC encoding device comprises:

a matrix generating unit 602, being used for generating a generator matrix $G_{ldgc}$ with K rows and N columns. Wherein, a phalanx $G_{ldgc}(1:K, 1:K)$ that consists of the first K columns and all rows of the generator matrix $G_{ldgc}$, is an upper triangular matrix (or a lower triangular matrix). The matrix generating unit outputs $G_{ldgc}(1:K, 1:K)$ to a subsequent precoding unit, and outputs $G_{ldgc}(1:K, 1:N)$ to a subsequent block code encoding unit. Wherein, K N;

the precoding unit 604, being used for generating an input 1*K intermediate variable I by solving a function of a 1*K information bit stream s, and outputting an intermediate variable I to the block code encoding unit (as shown in FIG. 8, the precoding unit may be a unit for solving an upper and/or a lower triangular function, with two inputs, one being $G_{ldgc}(1:L, 1:L)$ and the other being an L-length information bit sequence m);

the block code encoding unit 606, being used for encoding the input intermediate variable I, generating a 1*N binary code word C and sending C out (as shown in FIG. 9, the block code encoding unit may be a unit for the matrix multiplying, with two inputs, one being $G_{ldgc}$, and the other being the L-length intermediate variable I).

Wherein, the matrix generating unit determines a generator matrix according to the following rules: in every column of the generator matrix, the number of element "1" (i.e. the column weight) must be in accordance with a certain degree distribution principle. The phalanx composed by the first K columns and all rows of the generator matrix is an upper-left triangular matrix, a lower-left triangular matrix, an upper-right triangular matrix, or a lower-right triangular matrix (as shown in FIG. 3).

Wherein, according to that the LDGC is a systematic code (as the LDGC is a systematic code, then $I \times G_{ldgc}(1:K, 1:K)=s$), the precoding unit solves the function when $G_{ldgc}(1:K, 1:K)$ is an upper triangular matrix (or a lower triangular matrix) to obtain a 1*K intermediate variable I, and outputs I.

Wherein, the block code encoding unit encodes the intermediate variable I according to $C=I \times G_{ldgc}$, gets a 1*N binary code word stream and outputs it.

For example, there is a 1*K=1*24 binary information bit data stream s (s may be denoted as D99274 in hexadecimal format) that is to be encoded into 72-bit LDGC by the encoding device according to another embodiment of the present invention, wherein K=24, N=72.

Figure 7:
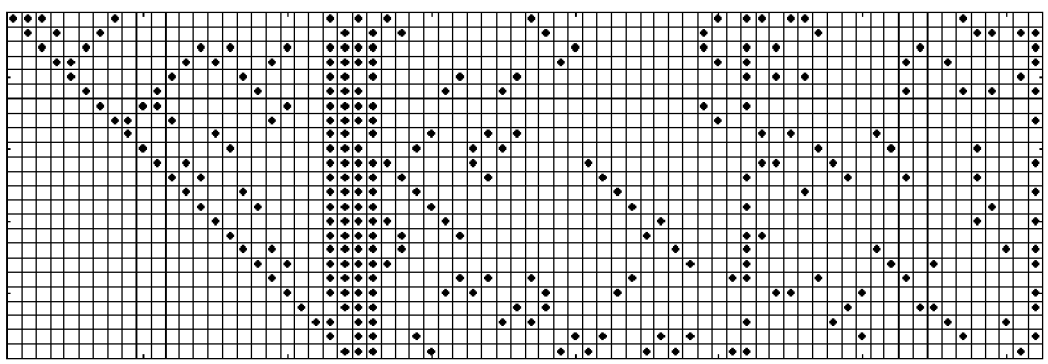
FIG. 7 is an example of the LDGC generator matrix without filled bits according to another embodiment of the present invention.

The matrix generating unit generates a generator matrix $G_{ldgc}$ with K=24 rows and N=72 columns. Therein, the $G_{ldgc}$ adopts a degree distribution principle similar to that of LT codes, and a phalanx $G_{ldgc}(1:K, 1:K)=G_{ldgc}(1:24, 1:24)$ composed by the first K columns and all rows of $G_{ldgc}$ is an upper-right triangular matrix, as shown in FIG. 7 (therein, the black spots denote element "1", while blank positions denote element "0"). The matrix generating unit outputs $G_{ldgc}(1:K, 1:K)=G_{ldgc}(1:24, 1:24)$ to the subsequent precoding unit, and outputs $G_{ldgc}(1:K, 1:N)=G_{ldgc}(1:24, 1:72)$ to the subsequent block code encoding unit.

According to that the LDGC is a systematic code and $I \times G_{ldgc}(1:L, 1:L)=m$, and since $G_{ldgc}(1:K, 1:K)=G_{ldgc}(1:24, 1:24)$ is an upper-right triangular matrix, the precoding unit solves the function of the input 1*K information bit stream s to generate a 1*K=1*24 intermediate variable I (I may be denoted as B4B304 in hexadecimal format), and outputs I to the block code encoding unit.

According to $C=I \times G_{ldgc}$, the block encoding unit encodes the input intermediate variable I to generate a 1*N=1*72 binary code word c (c is denoted as D99274A593CC1AC461 in hexadecimal format), and sends c out.

To be noted, although $G_{ldgc}(1:48,1:48)$ and $G_{ldgc}(1:24,1:24)$ are illustrated to be the upper-right triangular matrixes, other forms of matrixes are also applicable for the present invention. Accordingly, positions where filling bits are added are not limited as above. If only an intermediate vector is obtained using the characteristic of the systematic code, and the codes are generated and output via the intermediate vector, the same technical effects may be obtained.

Besides, still to be noted, although the degree distribution of the generator matrix $G_{ldgc}$ is illustrated to be similar to that of LT codes in the above embodiments, the present invention is not limited as above, and the same technical effects may be obtained if only the LDGC matrix is generated according to a certain degree distribution.

In sum, the present invention may support encoding of any information block length and any code rate, and is similar to Raptor codes in performance, both of which can reach the optimal theoretical performance.

The present invention is not limited to the above described exemplary embodiments. For those skilled in the art, various modifications and changes may be made to the present invention. Any modification, equivalent substitute and improvement within the spirit of the present invention is deemed to be included within the scope of the present invention, as defined by the claims.

What is claimed is:

1. A method for encoding the Low Density Generator Matrix Code (LDGC), comprising the following steps:
   constructing a generator matrix $G_{ldgc}$ with L rows and N+L−K columns, wherein, an phalanx $G_{ldgc}(1:L, 1:L)$ consisting of L rows and the first L columns of the generator matrix $G_{ldgc}$ being an upper triangular matrix or a lower triangular matrix, the K, L and N being positive integers, and K<L<N;
   adding L−K known bits to a K-length information bit sequence that is to be encoded, and generating an information bit sequence m with a length of L;
   according to $I \times G_{ldgc}(1:L, 1:L)=m$, using the phalanx $G_{ldgc}(1:L, 1:L)$ consisting of L rows and the first L columns of the generator matrix $G_{ldgc}$ and the information bit sequence m with a length of L, generating an intermediate variable I, and according to $C=I \times G_{ldgc}$, using the generator matrix $G_{ldgc}$ to encode the intermediate variable I, and generating an encoding sequence with a length of N+L−K; and
   deleting L−K known bits from the encoding sequence with a length of N+L−K, and generating an encoding sequence with a length of N.

2. The encoding method according to claim 1, wherein, when the phalanx $G_{ldgc}(1:L, 1:L)$ that consists of L rows and the first L columns of the generator matrix $G_{ldgc}$ is an upper-left triangular matrix or a lower-left triangular matrix, adding the L−K known bits in front of the K-length information bit sequence that is to be encoded.

3. The encoding method according to claim 2, wherein, a column weight of the generator matrix $G_{ldgc}$ being in accordance with a degree distribution principle similar to that of LT codes.

4. The encoding method according to claim 1, wherein, when the phalanx $G_{ldgc}(1:L, 1:L)$ which consists of L rows and the first L columns of the generator matrix $G_{ldgc}$ is an upper-right triangular matrix or a lower-right triangular matrix, adding the L−K known bits after the K-length information bit sequence that is to be encoded.

5. The encoding method according to claim 4, wherein, a column weight of the generator matrix $G_{ldgc}$ being in accordance with a degree distribution principle similar to that of LT codes.

6. The encoding method according to claim 1, wherein, a column weight of the generator matrix $G_{ldgc}$ being in accordance with a degree distribution principle similar to that of LT codes.

7. A method for the encoding Low Density Generator Matrix Code (LDGC), comprising the following steps:
   constructing a generator matrix $G_{ldgc}$ with K rows and N columns, wherein a phalanx $G_{ldgc}(1:K, 1:K)$ that consists of K rows and the first K columns of the generator matrix $G_{ldgc}$ being an upper triangular matrix or a lower triangular matrix, the K and N being positive integers, and K<N;
   according to $I \times G_{ldgc}(1:K, 1:K)=s$, using the K-length information bit sequence s that is to be encoded and the phalanx $G_{ldgc}(1:K, 1:K)$ that consists of K rows and the first K columns of the generator matrix $G_{ldgc}$, generating an intermediate variable I; and
   according to $C=I \times G_{ldgc}$, encoding the intermediate variable I by using the generator matrix $G_{ldgc}$, and generating a code word with a length of N.

8. The encoding method according to claim 7, wherein, the phalanx $G_{ldgc}(1:K, 1:K)$ that consists of K rows and the first K columns of the generator matrix $G_{ldgc}$ being an upper-left triangular matrix, or a lower-left triangular matrix, or an upper-right triangular matrix, or a lower-right triangular matrix.

9. The encoding method according to claim 8, wherein, a column weight of the generator matrix $G_{ldgc}$ being in accordance with a degree distribution principle similar to that of LT codes.

10. The encoding method according to claim 7, wherein, a column weight of the generator matrix $G_{ldgc}$ being in accordance with a degree distribution principle similar to that of LT codes.

11. A device for the encoding Low Density Generator Matrix Code (LDGC), in a sender or a receiver, the device comprising: a matrix generating unit in one or more memories, being used for generating a generator matrix $G_{ldgc}$ with L rows and N+L−K columns in one or more memories, outputting the generated matrix $G_{ldgc}$ to a block code encoding unit, and outputting a phalanx $G_{ldgc}(1:L, 1:L)$ that consists of L rows and the first L columns of the generator matrix $G_{ldgc}$ to a precoding unit, wherein, the phalanx $G_{ldgc}(1:L, 1:L)$ that consists L rows and the first L columns of the generator matrix $G_{ldgc}$ being an upper triangular matrix or a lower triangular matrix, the K, L and N being positive integers, and K<L<N;

a bit filling unit, being used for adding L−K known bits to a K-length information bit sequence that is to be encoded, generating an information bit sequence m with a length of L, and outputting the generated information bit sequence m with a length of L to the precoding unit;

the precoding unit, being used for according to $I \times G_{ldgc}(1:L, 1:L)=m$, by using the phalanx $G_{ldgc}(1:L, 1:L)$ that consists of L rows and the first L columns of the generator matrix $G_{ldgc}$ and the information bit sequence m with a length of L, generating an intermediate variable I, and outputting the intermediate variable I to the block code encoding unit;

the block code encoding unit, being used for according to $C=I \times G_{ldgc}$, using the generator matrix $G_{ldgc}$ to encode the intermediate variable I, and generating an encoding sequence with a length of N+L−K; and a bit deleting unit, being used for deleting L−K known bits from the encoding sequence with a length of N+L−K, generating an encoding sequence with a length of N.

12. The encoding device according to claim 11, wherein, the phalanx $G_{ldgc}(1:L, 1:L)$ that consists of L rows and the first L columns of the generator matrix $G_{ldgc}$ being an upper-left triangular matrix, or a lower-left triangular matrix, or an upper-right triangular matrix, or a lower-right triangular matrix.

13. The encoding device according to claim 12, wherein, when the phalanx $G_{ldgc}(1:L, 1:L)$ that consists of L rows and the first L columns of the generator matrix $G_{ldgc}$ is an upper-left triangular matrix or a lower-left triangular matrix, the bit filling unit adding L−K known bits in front of the K-length information bit sequence that is to be encoded.

14. The encoding device according to claim 13, wherein, a column weight of the generator matrix $G_{ldgc}$ being in accordance with a degree distribution principle similar to that of LT codes.

15. The encoding device according to claim 12, wherein, when the phalanx $G_{ldgc}(1:L, 1:L)$ that consists L rows and the first L columns of the generator matrix $G_{ldgc}$ is an upper-right triangular matrix or a lower-right triangular matrix, the bit filling unit adding L−K known bits after the K-length information bit sequence that is to be encoded.

16. The encoding device according to claim 15, wherein, a column weight of the generator matrix $G_{ldgc}$ being in accordance with a degree distribution principle similar to that of LT codes.

17. The encoding device according to claim 12, wherein, a column weight of the generator matrix $G_{ldgc}$ being in accordance with a degree distribution principle similar to that of LT codes.

18. The encoding device according to claim 11, wherein, a column weight of the generator matrix $G_{ldgc}$ being in accordance with a degree distribution principle similar to that of LT codes.

19. A device for encoding the Low Density Generator Matrix Code (LDGC), comprising: a matrix generating unit in one or more memories, being used for generating a generator matrix $G_{ldgc}$ with K rows and N columns in one or more memories, wherein, a phalanx $G_{ldgc}(1:K, 1:K)$ that consists of K rows and the first K columns of the generator matrix $G_{ldgc}$ being an upper triangular matrix or a lower triangular matrix, the K and N being positive integers, and K<N;

a precoding unit, being used for according to $I \times G_{ldgc}(1:K, 1:K)=s$, by using a K-length information bit sequence s that is to be encoded and the phalanx $G_{ldgc}(1:K, 1:K)$ that consists of K rows and the first K columns of the generator matrix $G_{ldgc}$, generating an intermediate variable I; and a block code encoding unit, being used for according to $C=I \times G_{ldgc}$, using the generator matrix $G_{ldgc}$ to encode the intermediate variable I, and generating a code word with a length of N.

20. The encoding device according to claim 19, wherein, the phalanx $G_{ldgc}(1:K, 1:K)$ that consists of K rows and the first K columns of the generator matrix $G_{ldgc}$ being an upper-left triangular matrix, or a lower-left triangular matrix, or an upper-right triangular matrix, or a lower-right triangular matrix.

21. The encoding device according to claim 20, wherein, a column weight of the generator matrix $G_{ldgc}$ being in accordance with a degree distribution principle similar to that of LT codes.

22. The encoding device according to claim 19, wherein, a column weight of the generator matrix $G_{ldgc}$ being in accordance with a degree distribution principle similar to that of LT codes.

* * * * *